United States Patent
Chen et al.

(10) Patent No.: US 10,290,993 B2
(45) Date of Patent: May 14, 2019

(54) VCSEL ILLUMINATOR PACKAGE

(71) Applicant: Princeton Optronics, Inc., Mercerville, NJ (US)

(72) Inventors: Tong Chen, Bell Mead, NJ (US); Chuni Ghosh, West Windsor, NJ (US); Qing Wang, Plainsboro, NJ (US); Alexey Kovsh, Irvine, CA (US); Laurence Watkins, Pennington, NJ (US)

(73) Assignee: Princeton Optronics, Inc., Mercerville, NJ (US)

( * ) Notice: Subject to any disclaimer, the term of this patent is extended or adjusted under 35 U.S.C. 154(b) by 0 days.

(21) Appl. No.: 15/605,362

(22) Filed: May 25, 2017

(65) Prior Publication Data

US 2017/0353004 A1    Dec. 7, 2017

Related U.S. Application Data

(60) Provisional application No. 62/345,025, filed on Jun. 3, 2016.

(51) Int. Cl.
| | |
|---|---|
| *H01S 5/022* | (2006.01) |
| *H01S 5/183* | (2006.01) |
| *H01S 5/00* | (2006.01) |
| *H01S 5/40* | (2006.01) |

(Continued)

(52) U.S. Cl.
CPC ........ *H01S 5/02288* (2013.01); *H01S 5/0014* (2013.01); *H01S 5/022* (2013.01); *H01S 5/02228* (2013.01); *H01S 5/02296* (2013.01); *H01S 5/06825* (2013.01); *H01S 5/183* (2013.01); *H01S 5/4025* (2013.01); *H01L 2224/48091* (2013.01); *H01S 5/1833* (2013.01); *H01S 5/18311* (2013.01); *H01S 5/423* (2013.01)

(58) Field of Classification Search
CPC .... H01S 5/02288; H01S 5/0014; H01S 5/022; H01S 5/02228; H01S 5/183; H01S 5/4025
See application file for complete search history.

(56) References Cited

U.S. PATENT DOCUMENTS

| | | | |
|---|---|---|---|
| 5,974,066 A * | 10/1999 | Wu | ............... H01S 5/02296 |
| | | | 372/33 |
| 6,816,523 B1 | 11/2004 | Glenn et al. | |

(Continued)

OTHER PUBLICATIONS

International Search Report and Written Opinion issued in Application No. PCT/US2017/034458 dated Jul. 26, 2017, 12 pages.

*Primary Examiner* — Armando Rodriguez
(74) *Attorney, Agent, or Firm* — Fish & Richardson P.C.

(57) ABSTRACT

A VCSEL illuminator module includes a module forming a physical cavity having electrical contacts positioned on an inner surface of the module that feed through the module to electrical contacts positioned on an outer surface of the module. A VCSEL device is positioned on the inner surface module and includes electrical contacts that are electrically connected to the electrical contacts on the inner surface of the module. The VCSEL device generates an optical beam when current is applied to the electrical contacts. An optical element is positioned adjacent to an emitting surface of the VCSEL device and is configured to modify the optical beam generated by the VCSEL device.

35 Claims, 12 Drawing Sheets

(51) Int. Cl.
  *H01S 5/068* (2006.01)
  *H01S 5/42* (2006.01)

(56) References Cited

U.S. PATENT DOCUMENTS

| | | |
|---|---|---|
| 2005/0062055 A1* | 3/2005 | Gallup ................ H01S 5/02288 |
| | | 257/98 |
| 2013/0163627 A1 | 6/2013 | Seurin et al. |
| 2014/0160751 A1* | 6/2014 | Hogan .................... H01S 5/005 |
| | | 362/235 |
| 2014/0269796 A1 | 9/2014 | Geske et al. |
| 2015/0069113 A1* | 3/2015 | Wang .................. H01S 5/02272 |
| | | 228/102 |
| 2015/0260830 A1 | 9/2015 | Ghosh et al. |

\* cited by examiner

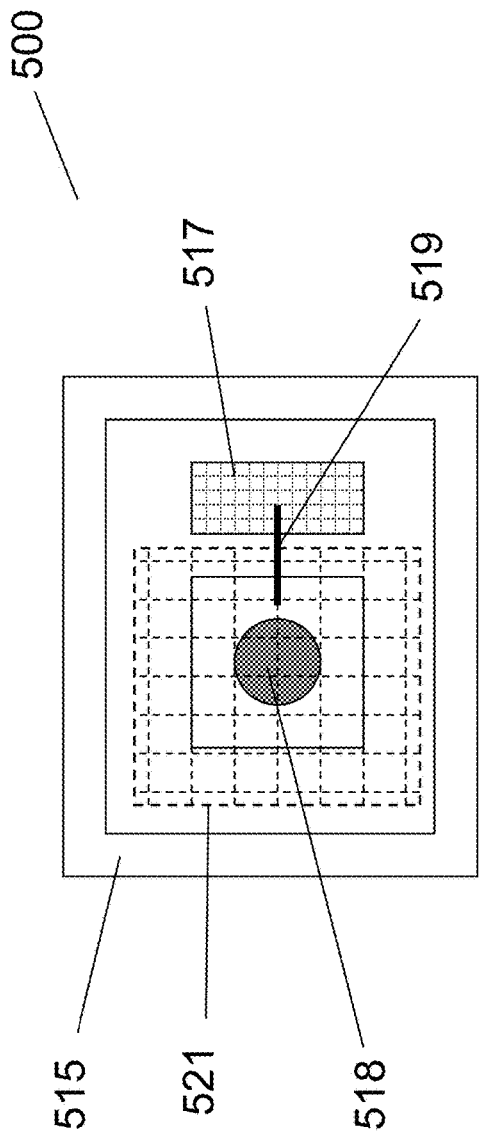
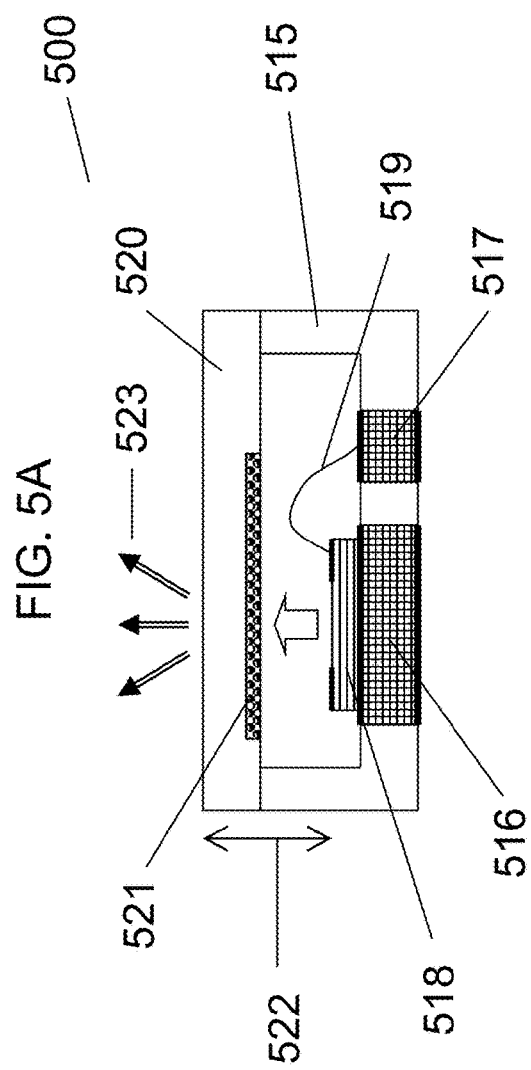

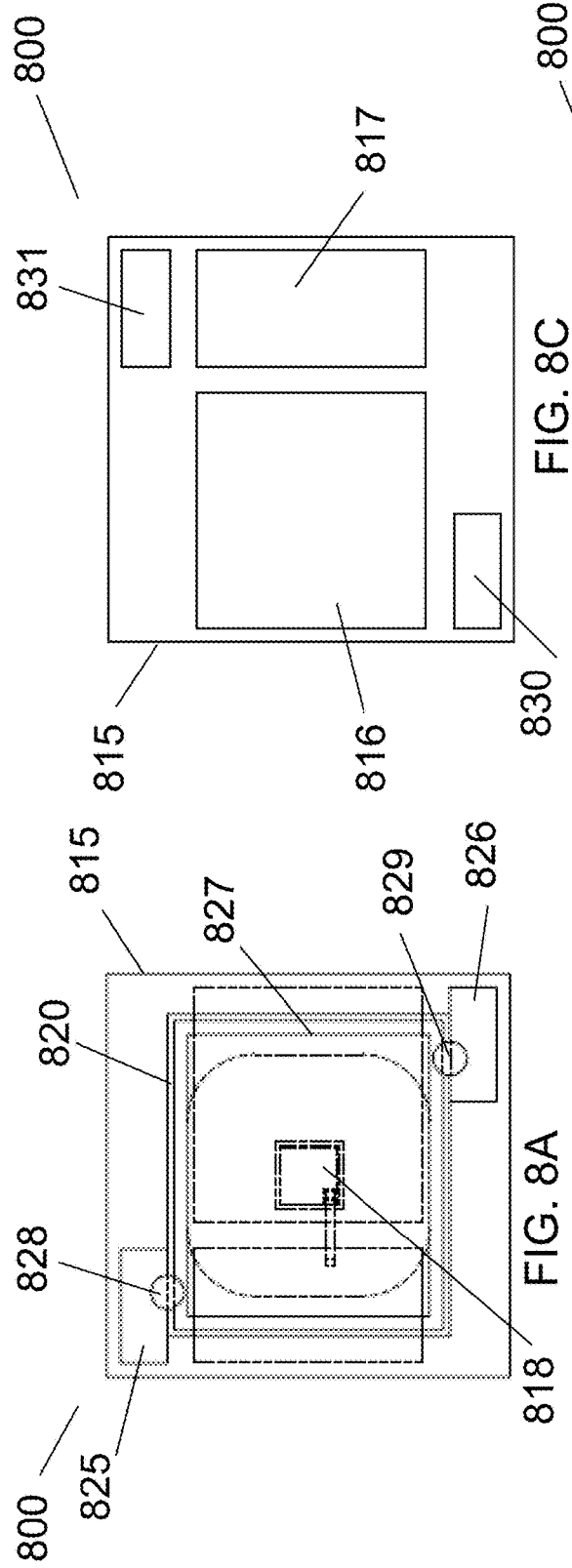
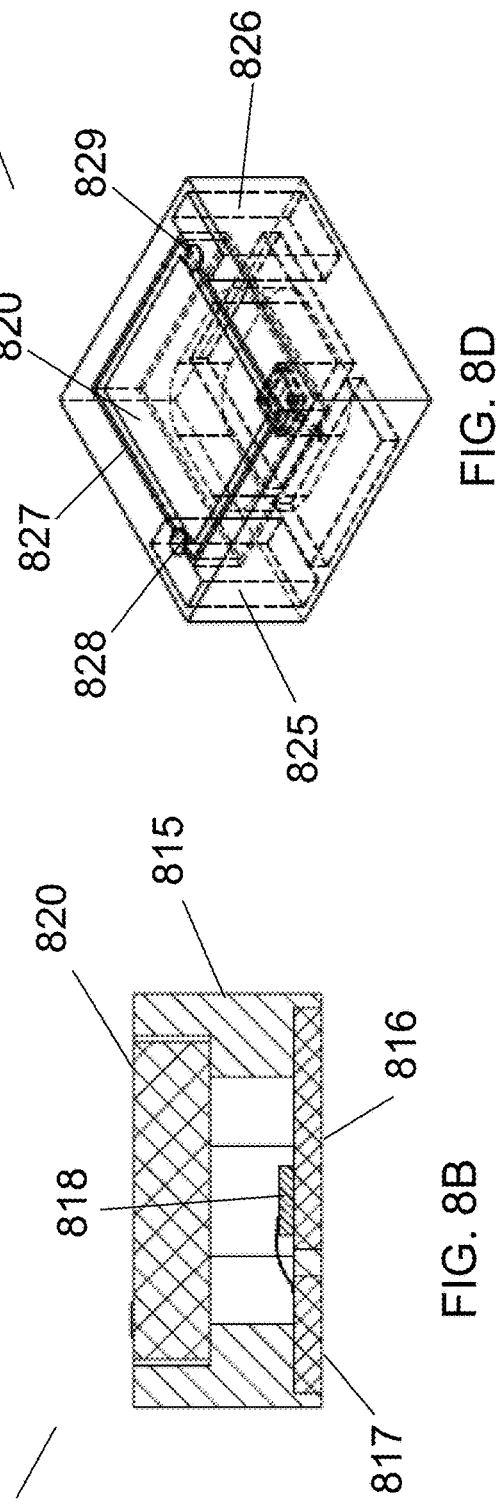

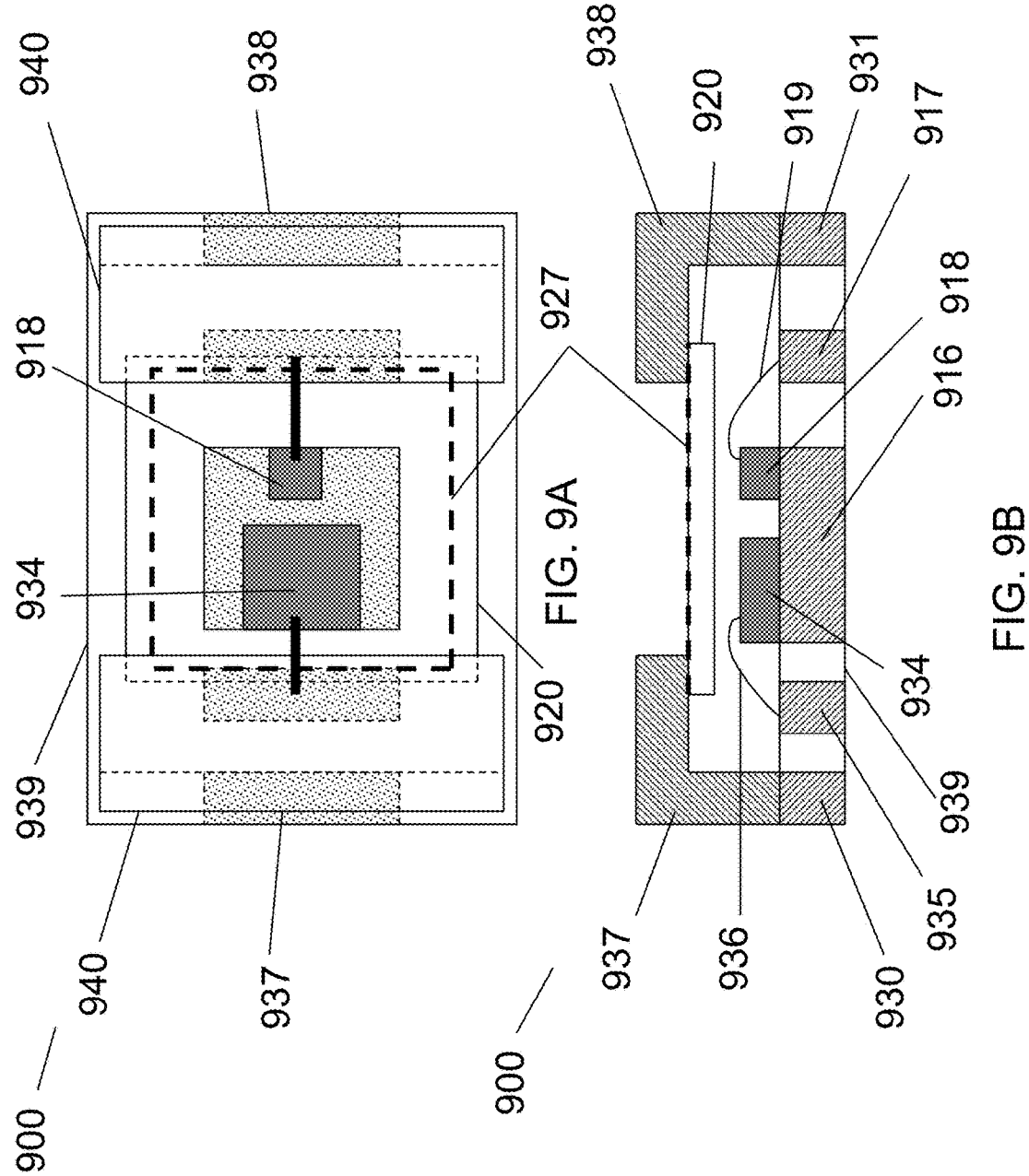

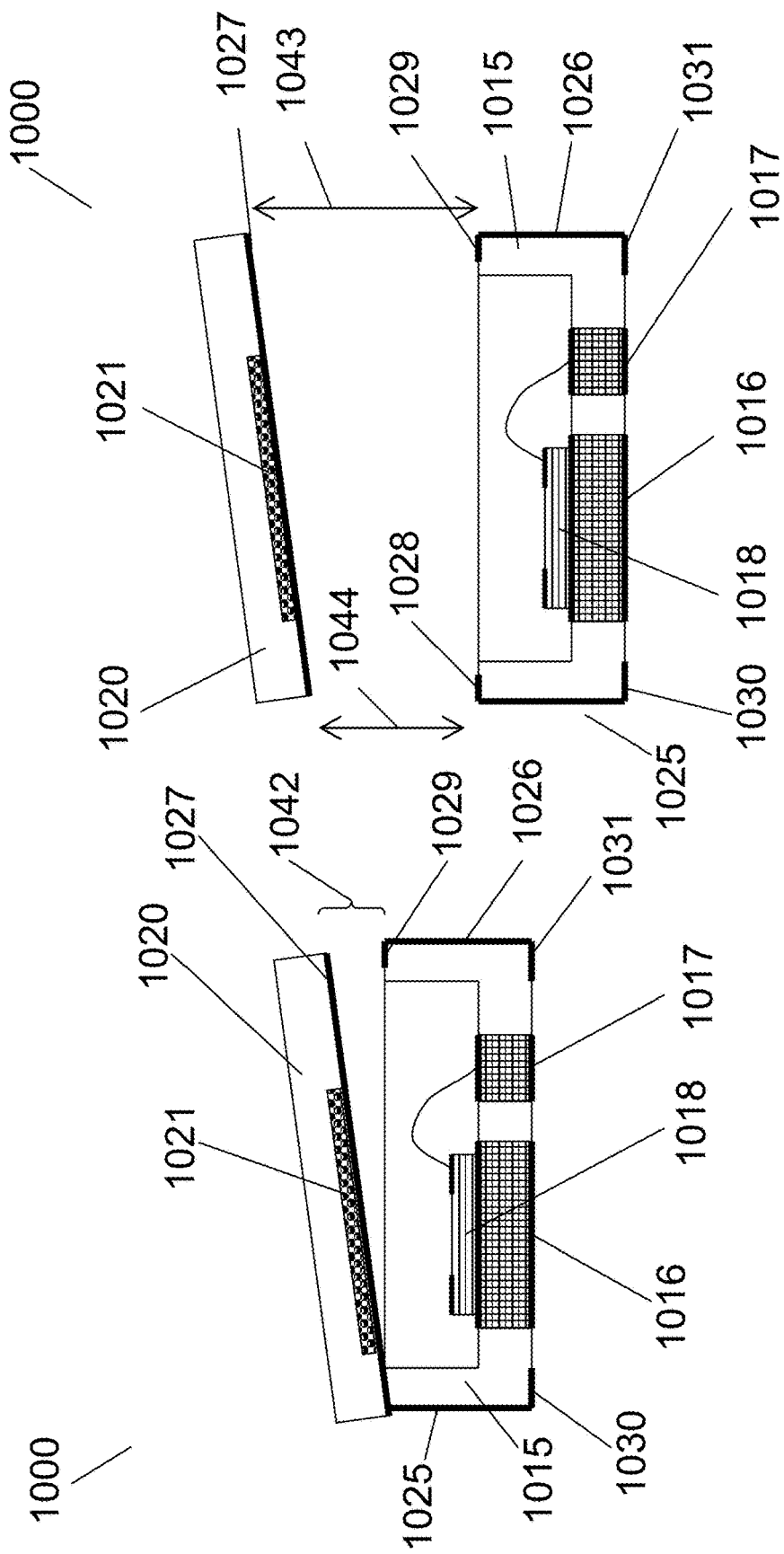

VCSEL ILLUMINATOR PACKAGE

CROSS-REFERENCE TO RELATED APPLICATION SECTION

The present application is a non-provisional application of U.S. Provisional Patent Application No. 62/345,025, entitled "Miniature VCSEL Illuminator Package", filed on Jun. 3, 2016. The entire contents of U.S. Provisional Patent Application No. 62/345,025 are herein incorporated by reference.

The section headings used herein are for organizational purposes only and should not to be construed as limiting the subject matter described in the present application in any way.

INTRODUCTION

New features are being added to cell phones and tablets which include technologies to record three dimensional images, sense motion and gestures etc. The digital recording methods use various types of miniature illuminators that interact with cameras to record dynamical events in three dimensional regions. There are numerous types of illuminators that can deliver different types of illuminating functions. Some illuminators illuminate a wide area with very short pulses for LIDAR-type measurements that record time-of-flight information. Other illuminators are pulsed or CW and project structured light patterns onto a scene. The digital camera records an image of the structured light pattern and then software algorithms are used to determine 3-dimensional scene information derived from modifications in the pattern image.

Miniature illuminators are installed in mobile devices, such as cell phones and tablets, and therefore need to be physically small in size, typically 3-mm-or-less high and a few millimeters in lateral dimensions. These miniature illuminators are planned for use in cell phones and tablets that use the Google Tango technology for three-dimensional sensing. This includes devices made by Lenovo Group Ltd. and other cell phone manufacturers. These miniature illuminators must be designed for high volume low cost manufacture and also for low cost assembly into end use devices. For this application, the illuminator should be compatible with high volume electronic surface mount assembly practices.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

FIG. 5A illustrates a top-view of an embodiment of a miniature illumination package of the present teaching comprising a wire bond.

FIG. 5B illustrates a side-view of an embodiment of a miniature illumination package of FIG. 5A.

FIG. 8A illustrates a top-view of an embodiment of a miniature illumination package comprising an electrical trace on the top of an optical component of the present teaching.

FIG. 8B illustrates a side-view of an embodiment of a miniature illumination package of FIG. 8A.

FIG. 8C illustrates a bottom-view of an embodiment of a miniature illumination package of FIG. 8A.

FIG. 8D illustrates a perspective-view of an embodiment of a miniature illumination package of FIG. 8A.

FIG. 9A illustrates a top-view of an embodiment of a miniature illumination package of the present teaching comprising a monitor detector.

FIG. 9B illustrates a side-view of an embodiment of a miniature illumination package of FIG. 9A.

FIG. 10A illustrates a side-view of an embodiment of a miniature illumination package of the present teaching with the optical component partly detached.

FIG. 10B illustrates a side-view of an embodiment of a miniature illumination package of FIG. 10A with the optical wholly detached.

DESCRIPTION OF VARIOUS EMBODIMENTS

Figure 1:
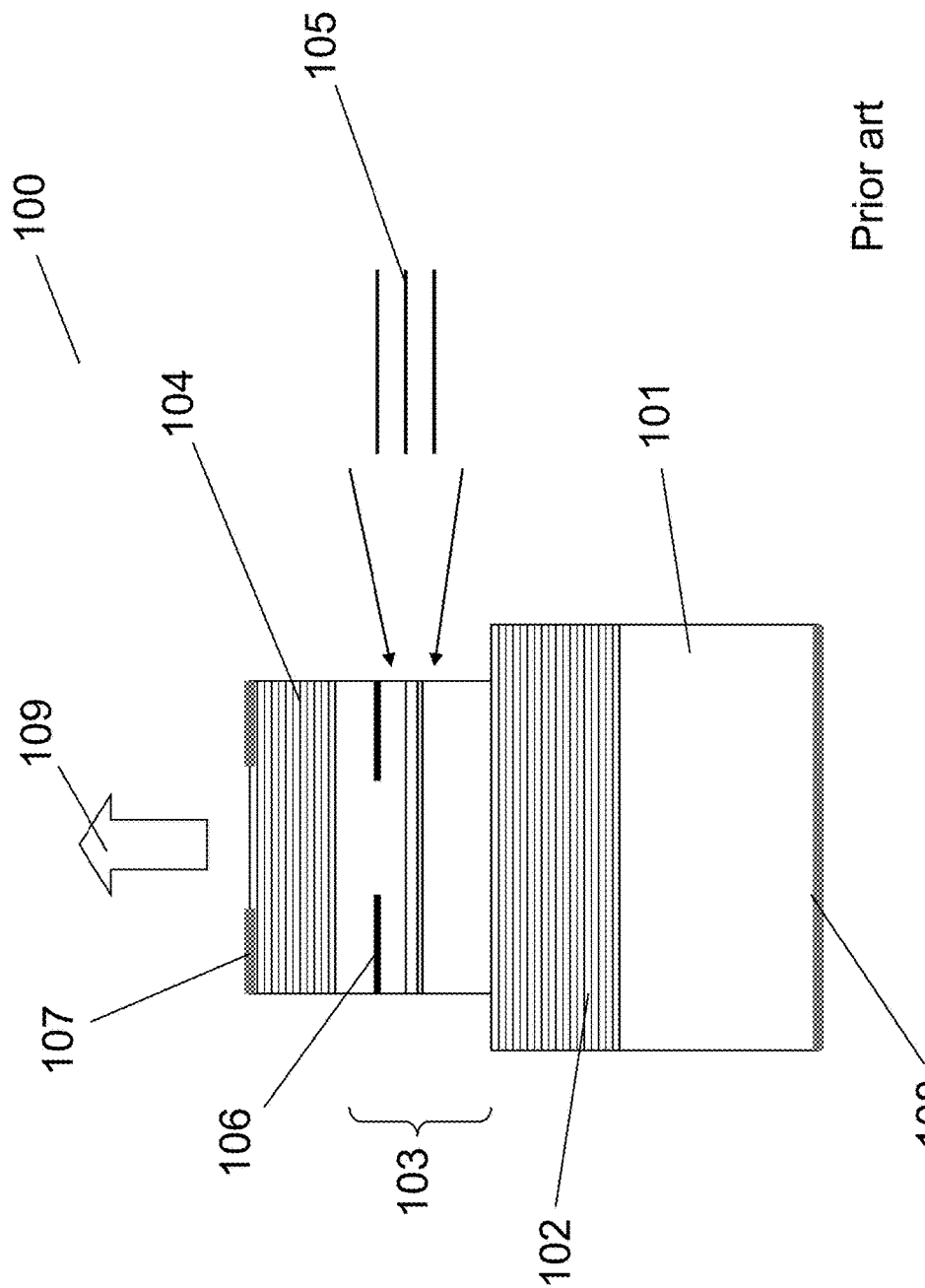
FIG. 1 illustrates a design for a prior art top-emitting VCSEL device.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings can be performed in any order and/or simultaneously as long as the teaching remains operable. Furthermore, it should be understood that the apparatus and methods of the present teachings can include any number or all of the described embodiments as long as the teaching remains operable.

The present teaching relates to miniature Vertical Cavity Surface Emitting Lasers (VCSEL) illuminator modules that include an optical component for modifying the illumination pattern. The miniature VCSEL illuminator modules may also incorporate a laser safety feature that interrupts an electrical circuit when the component is displaced which would otherwise allow the direct unsafe VCSEL beam to propagate out and potentially cause eye damage.

One technology that is suitable for miniature illuminators is high-power VCSEL devices and VCSEL array devices. High-power VCSEL devices and high-power VCSEL arrays can be pulsed with very fast rise times suitable for time-of-flight applications. High-power VCSEL devices and high-power VCSEL arrays are small but produce high-power laser beams with efficient electro-optic conversion. For example, in high-power pulsed operation, the power level for each VCSEL element can be on order of 10 W or higher. The upper limit of the power after passing through optical elements is determined by laser eye safe threshold energy which depends on variables, such as power, pulse length and repetition rate. For CW (continuous) operation, the power level for each VCSEL element would be up to a few milliwatts so that the brightness of the illumination after passing through the optical element is below the laser eye safe threshold. The output beam of high-power VCSEL devices and high-power VCSEL arrays is typically well collimated. However, various optical components can be placed in the path of the output beam to modify the beam properties, including shape and divergence, as desired based on the specific application.

Prior art packaging technology for miniature illuminators can be quite complex. The packaging uses extra components, such as spacers for mounting optical components at the specific design operating location. One feature of the miniature VCSEL illuminators of the present teaching is they may utilize a simpler packaging technology. Another feature of the miniature VCSEL illuminators of the present teaching is they can produce high optical power required for cell phone and tablets. Another feature of the miniature VCSEL illuminators of the present teaching is they are suitable for recording three-dimensional images, and sensing motion and gestures. Other features of the miniature VCSEL illuminators of the present teaching are they can be manufactured in high volume at low cost and that they can incorporate electrical pads suitable for high-volume-surface mount assembly practices.

One feature of the high-power miniature VCSEL illuminators of the present teaching is that they can meet laser eye safety regulations when operated in the mobile devices. For example, some embodiments of the VCSEL illuminators of the present teaching include laser safety interlock features so that, in the event of damage to any optical component in the path of the VCSEL beam, an electrical interlock signal is available for switching off the VCSEL device using a control circuit.

The miniature VCSEL illuminators of the present teaching overcome the complexity of prior art miniature illuminators by using a single molded structure that includes all the electrical pad feedthroughs. The single molded structure also has the features necessary for mounting optical components. Some embodiments of the molded structure can include the laser safety interrupt connections so that separate electrically connected structures to achieve this function can be eliminated.

Some embodiments of the molded package structure utilize a physical cavity that is formed in an inner surface of the module in which the VCSEL device is mounted. The cavity has two or more electrical pads for connecting to the VCSEL bottom contact(s) and these pads have electrical feedthroughs to the bottom of the package structure to provide surface mount soldering electrical pads. Thus, electrical pads on an inner surface of the module that forms the cavity are connected through the module to electrical pads on an outer surface of the module to provide electrical connections from elements in the cavity to the outside of the module. For example, the pads can be formed of copper or aluminum. One of the pads can also provide direct mounting for the VCSEL contact to additionally provide a thermal path for cooling the VCSEL. The VCSEL second connection can be made by wire bonding to a second pad. If the VCSEL is configured for surface mounting with both VCSEL contacts on the bottom of the VCSEL device, it can be directly surface mounted onto the internal pads without the need for the wire bond contact.

Some embodiments of the molded package structure have sidewalls of a specified height. One or more optical components for modifying the VCSEL laser beam properties are mounted on these sidewalls. The sidewall height is designed so that when the optical component is attached at this height, the optical beam emerging from the optical component has the desired illumination pattern. Bonding the optical components to the structure can also provide an environmental seal, such as a hermetic seal or a laser safety seal for the VCSEL.

In some embodiments, a laser safety interrupt is constructed with an electrically conducting trace from one side of the optical component to another side. Electrical pads are molded into the package structure such that the top pads are at the same locations as the two ends of the optical component conducting trace. During attachment of the optical component, an electrical connection is made between the pads and the ends of the optical component trace using wire bonds or conductive adhesive or similar methods. The electrical pads in the molded structure are fed through to electrical pads on the bottom of the molded structure. This assembly produces an electrical continuity path between the two bottom pads. If and when the optical component is damaged and de-bonded from the molded structure, this electrical continuity path is broken, thereby providing a means for a signal to the driver that disables the VCSEL. In some embodiments, the two bottom pads are connected to a control circuit that monitors for electrical continuity between the two bottom pads. The control circuit activates and deactivates the VCSEL device based on the status of the electrical continuity between the two bottom pads.

Assembly of some embodiments of the miniature illuminator package results in a VCSEL illuminator module with four or more electrical pads on the bottom which can be surface mount soldered to a printed circuit board or similar electrical circuit medium used in the cell phone, tablet, or other mobile device. The surface mount electrical connection provides both activation for the VCSEL device and the laser safety interrupt circuit. In this way, the illuminator can be assembled at the same time and using the same process as the other electrical components.

FIG. 1 illustrates a design of a prior art VCSEL device 100. The VCSEL device 100 comprises a substrate 101. The VCSEL epitaxial structure is grown on the substrate 101, typically by a MOCVD process. A VCSEL laser cavity is formed by a bottom DBR high reflector 102 and a DBR partial reflector 104. In between is placed the gain section 103 which contains a set of multiple quantum wells 105 plus one or more apertures 106 to confine the current in the center of the VCSEL device. In this top emitting VCSEL, the output 109 is emitted as an optical beam from the partially reflecting top DBR mirror 104. The VCSEL is activated by applying current through the top 107 and bottom 108 contacts. The aperture 106 confines the current to the center region of the VCSEL to activate the multiple quantum wells 105 to produce optical gain and to generate a laser mode within the VCSEL laser cavity.

The pulse bandwidth of a VCSEL device is controlled by the laser cavity photon lifetime, the electro-optical transitions in the quantum wells, and the electrical driving circuit, including the VCSEL electrical properties. The pulse bandwidth is sometimes referred to as the modulation bandwidth. The cavity lifetime and quantum well transitions are very fast and so the modulation bandwidth is typically limited by the electrical properties of the driver circuit including connections to the VCSEL and the resistance and capacitance between the VCSEL electrical contacts 107 and 108.

Figure 2:
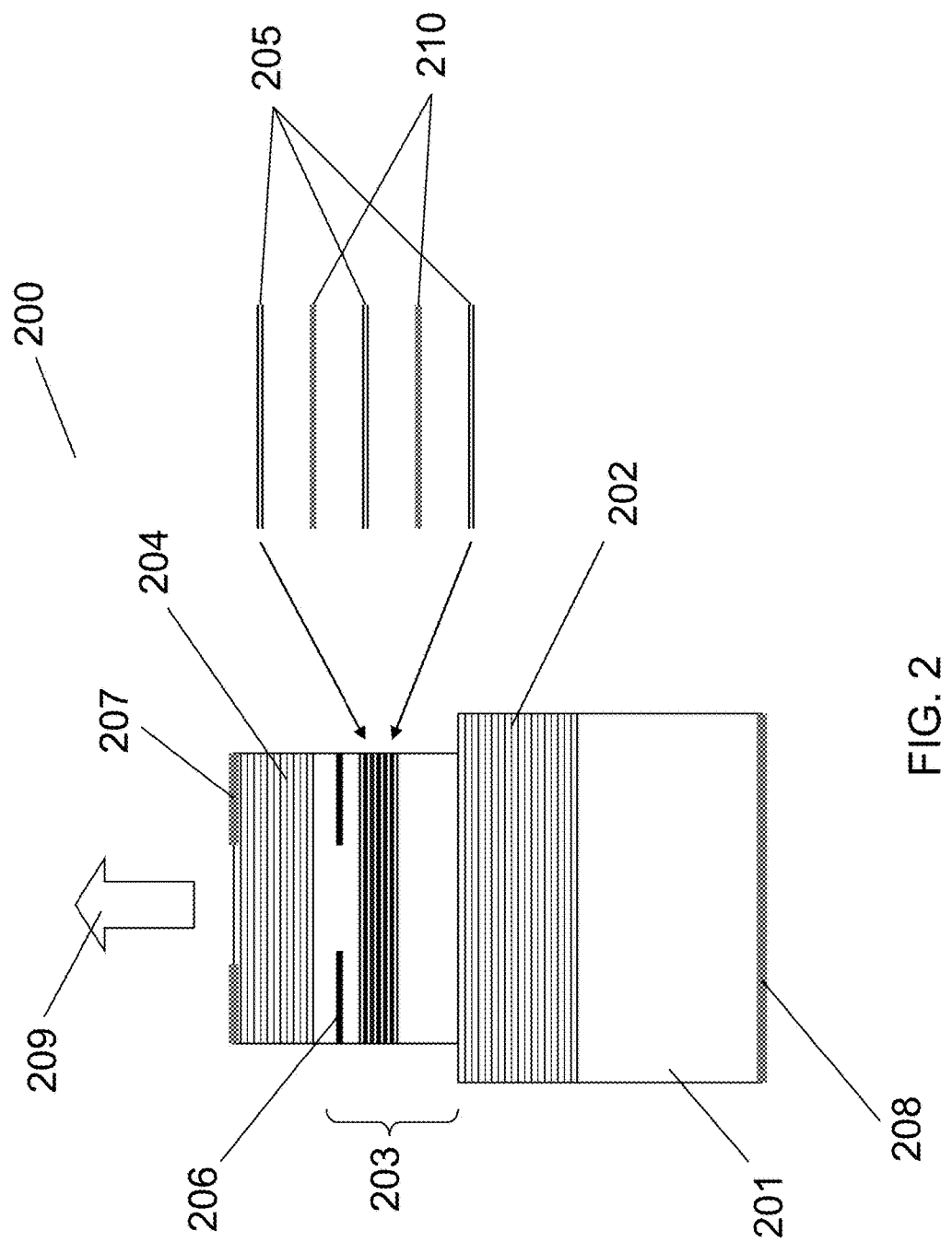
FIG. 2 illustrates a design for a high-power VCSEL device that includes multiple gain groups of multiple quantum wells separated by tunnel junction diodes according to the present teaching.

A recent advance in VCSEL technology is illustrated in FIG. 2. FIG. 2 illustrates a design for a high-power VCSEL device 200 that includes multiple gain groups of multiple quantum wells 205 separated by tunnel junction diodes 210 of the present teaching. This design results in higher power for the same VCSEL size as well as higher electro-optic conversion efficiency. See, for example, U.S. patent application Ser. No. 15/447,484, filed Mar. 2, 2017 entitled "High-Speed VCSEL Device", which is assigned to the assignee of the present application. The entire contents of U.S. patent application Ser. No. 15/447,484 are incorporated herein by reference.

The gain section 203 of the VCSEL device 200 has increased gain and an increase in gain length. The VCSEL device 200 comprises an epitaxial grown layer structure on the substrate 201. The bottom reflector is a DBR mirror 202 of multiple layers of alternating high and low refractive index. In this top-emitting version of the VCSEL device 200, the bottom reflector DBR mirror 202 is made high reflecting, and the top reflector DBR mirror 204 is made partially transmitting.

A gain section 203 comprising multiple groups of quantum wells 205 is positioned above the bottom reflector DBR mirror 202. Each group of quantum wells 205 can have, for example, two to four quantum wells or more depending on the specific design configuration. Each group of multiple quantum wells 205 is located at the anti-node or maximum optical intensity of the laser cavity mode. This results in maximum application of gain to the laser mode.

In the embodiment illustrated in FIG. 2, there are three groups of quantum wells 205. Tunnel junctions 210 are located in between each of the groups of quantum wells 205. Tunnel junctions 210 are very thin pn junctions with dimensions small enough for carriers to pass (or tunnel) through the junction barrier. The tunnel junctions 210 are located at the nodes of the laser cavity mode to minimize any absorption effects. In the specific embodiment of the VCSEL illustrated in FIG. 2, there are two tunnel junctions 210. Since there are three groups of quantum wells 205, the gain section is three times longer and the gain is three times larger than that of a standard VCSEL. This also results in up to three-times-higher power for the same activation current.

The gain section 203 contains one or more apertures 206 to confine the current in the center of the VCSEL device. The VCSEL is activated by applying current through the top 207 and bottom 208 contacts to produce light at output 209 in the form of an optical beam. For top emitting VCSELs, such as those indicated in the embodiment of FIG. 2, the substrate 201 can be thinned and, in some configurations, can be removed entirely. This improves the heat transfer from the gain region to the bottom contact 208.

Figure 3:
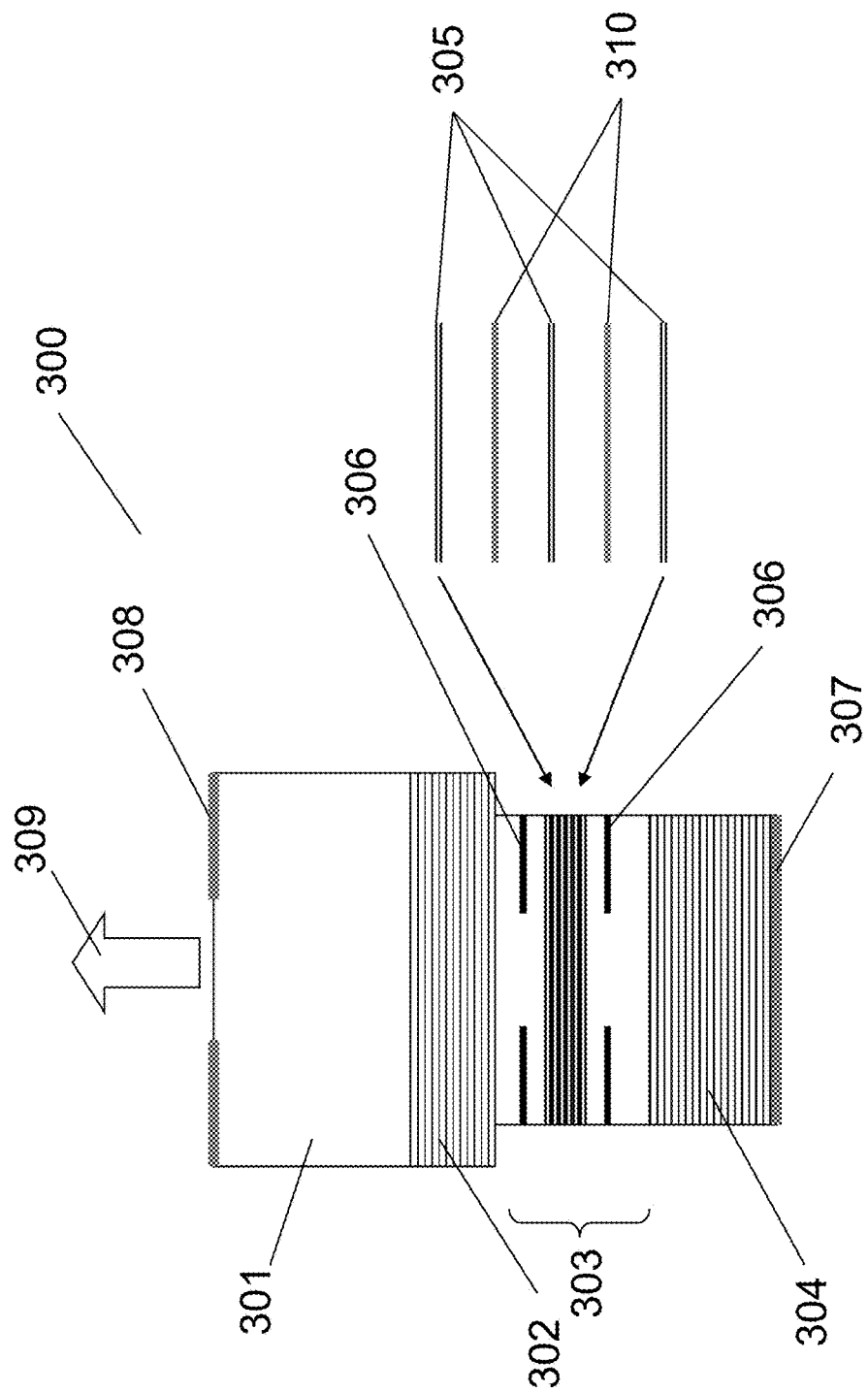
FIG. 3 illustrates a design for a bottom-emitting high-power VCSEL device that includes multiple gain groups of multiple quantum wells separated by tunnel junction diodes according to the present teaching.

FIG. 3 illustrates a design for a bottom-emitting high-power VCSEL device 300 that includes multiple gain groups of multiple quantum wells separated by tunnel junction diodes according to the present teaching. In this example, the VCSEL device 300 is configured as a bottom-emitting device wherein the light output 309 is taken through the bottom DBR mirror 302 and transmitted through the substrate 301 as an output optical beam. In this case, the top DBR mirror 304 is high reflecting and the bottom DBR mirror 302 is partial reflecting. In this particular embodiment the gain region 303 has three groups of multiple quantum wells 305 and two intervening tunnel junctions 310. There are two current apertures 306 that confine the current. Using two current apertures can provide improved current flow in the longer gain region. There is an electrical contact 308 on the substrate, sometimes referred to as a bottom contact, and an electrical contact 307 on the top DBR mirror 304, sometimes referred to as a top contact. See, for example, U.S. patent application Ser. No. 15/447,484, which is assigned to the assignee of the present application and which is incorporated herein by reference.

Similar to the top-emitting VCSEL device 200 of FIG. 2, the substrate 301 can be removed for bottom-emitting VCSELs. However, the advantage of removing the substrate 301 on the bottom emitting VCSEL 300 is different. Removing the substrate on the bottom emitting VCSEL 300 will reduce optical absorption in the substrate for these kinds of VCSELs. This is important, especially for the case of short wavelength VCSELs, in which the substrate optical absorption would be high. There are many possible configurations. See, for example, U.S. patent application Ser. No. 14/700,010 by Wang et al., filed on Apr. 29, 2015 and U.S. Provisional Patent Application No. 62/303,632 by Ghosh et al., filed on Mar. 4, 2016, both of which are assigned to Princeton Optronics Inc. Mercerville, N.J., the assignee of the present application. The entire contents of U.S. patent application Ser. No. 14/700,010 and U.S. Provisional Patent Application No. 62/303,632 are incorporated herein by reference.

One aspect of the present teaching is that various high-speed and CW multiple quantum well group VCSELs and VCSEL array configurations and types can be used for many different miniature illuminator applications. This includes VCSELs with different quantities of groups with multiple quantum wells. The VCSELs can be configured in arrays.

Figure 4A:
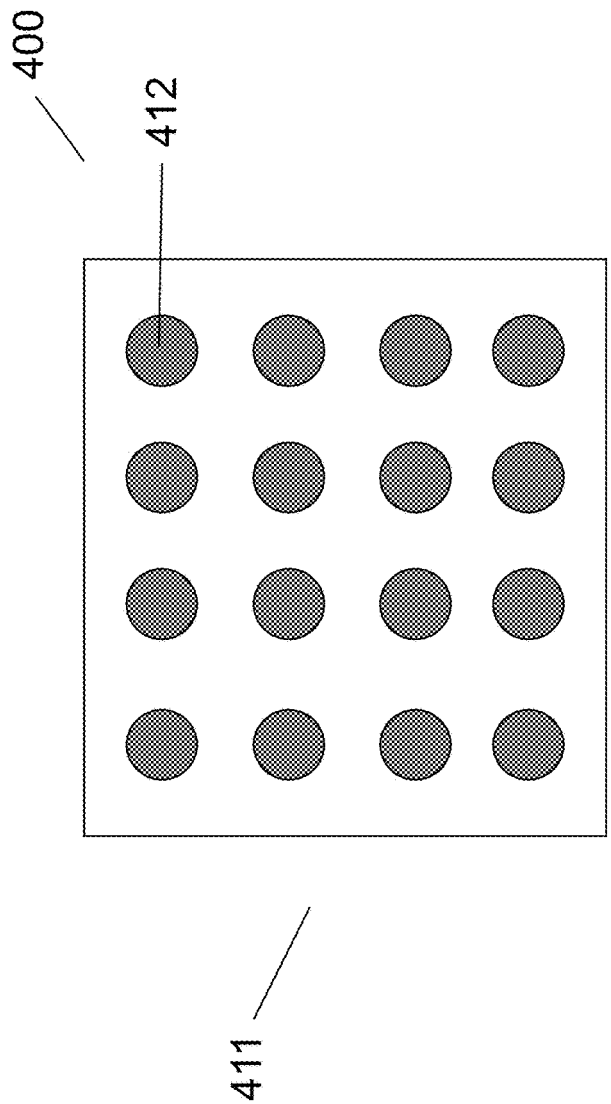
FIG. 4A illustrates a top-view of an embodiment of a VCSEL array of the present teaching.
Figure 4B:
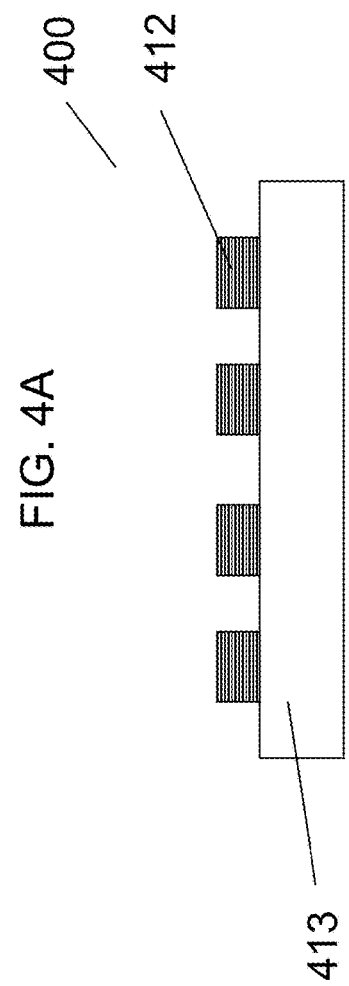
FIG. 4B illustrates a side-view of the embodiment of a VCSEL array of the present teaching of FIG. 4A.

FIG. 4A illustrates a top-view of an embodiment of a VCSEL array of the present teaching. FIG. 4 B illustrates a side-view of the embodiment of a VCSEL array of the present teaching of FIG. 4A. The VCSELs 412 are arranged in a square format array 411 and are fabricated on a common substrate 413. This square format array 411 configuration provides higher output power for the same brightness. This array 411 configuration provides larger illumination volumes and reduced brightness for laser safety. Individual VCSELs 412 are formed in a two-dimensional square format array 411 with 16 VCSELs 412 fabricated on a common substrate 413. Many different array formats can be used including hexagonal or even random distributions to optimally match the output to the illumination requirements for the particular application. Smaller VCSELs can be more efficient in some configurations and building arrays is a good method to create higher power VCSELs while maintaining high efficiency. Also, by having multiple VCSEL emitters, speckle is reduced since the multiple VCSELs devices are not coherent with each other. Finally, using VCSEL arrays increases the illumination power but does not increase the brightness since the ratio of power to the product of emitting area and divergence angle product is not increased. This means that the illumination power can be increased without changing the eye-safe power level.

FIG. 5A illustrates a top-view of an embodiment of a miniature illumination package 500 of the present teaching. FIG. 5B illustrates a side-view of an embodiment of a miniature illumination package 500 of FIG. 5A. The embodiment illustrated in FIGS. 5A-B is a basic miniature illumination package 500. The molded package structure 515 has electrical pads connected to conductive feedthroughs 516, 517 that run from inside the molded package structure 515 to the bottom outside surface of the molded package structure 515. The VCSEL 518 is mounted on one electrical pad and the second contact of the VCSEL is connected to the second pad using a wire bonded wire 519. An optical component 520 is bonded on top of the molded package structure 515 sidewalls.

The molded package structure 515 comprises a cavity for mounting the VCSEL device 518. The VCSEL device 518 can be a single VCSEL or can be a VCSEL array. The package structure 515 has conductive feedthroughs 516, 517 with pads on the inside for the VCSEL and pads on the outside for surface mount soldering to a printed circuit board. In this embodiment, the VCSEL device 518 is directly bonded to one of the pads 516 using solder or similar electrically conducting bonding material. This provides an electrical contact as well as providing a thermal conducting path. The second electrical contact is made to the VCSEL using a wire bonded wire 519 to the second pad 517.

An optical component 520 that modifies the characteristics of the VCSEL output beam(s) 523 is bonded to the top of the sidewalls of the molded package structure 515. The optical component 520 can include a lens that reduces a divergence angle of the optical beam generated by the VCSEL. The optical component 520 can be a microlens array. The microlens array can be aligned to an array of VCSEL devices at the bottom of the cavity. The optical component 520 can include a diffuser that increases the divergence of the VCSEL optical beam, for example, to an angle that is greater than or equal to 110 degrees in one specific embodiment.

The optical functional structure 521 can be formed on the bottom surface of the optical component 520 as shown. The optical functional structure 521 can also be formed on the top surface, or can be an integral structure to the optical component 520. The optical functional structure 521 can be an internal device, such as a graded index structure. The height 522 and lateral position of the optical component 520 in relation to the mounted VCSEL 518 is determined by the design parameters of the sidewalls of the molded package structure 515, so that no spacer or other extra piece-part is needed to fix the alignment.

Figure 6A:
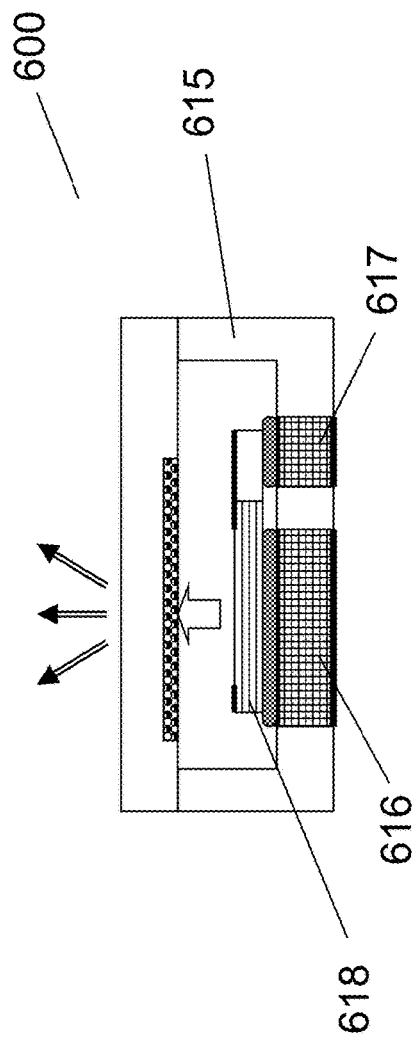
FIG. 6A illustrates a side-view of an embodiment of a miniature illumination package of the present teaching comprising a surface mount VCSEL.
Figure 6B:
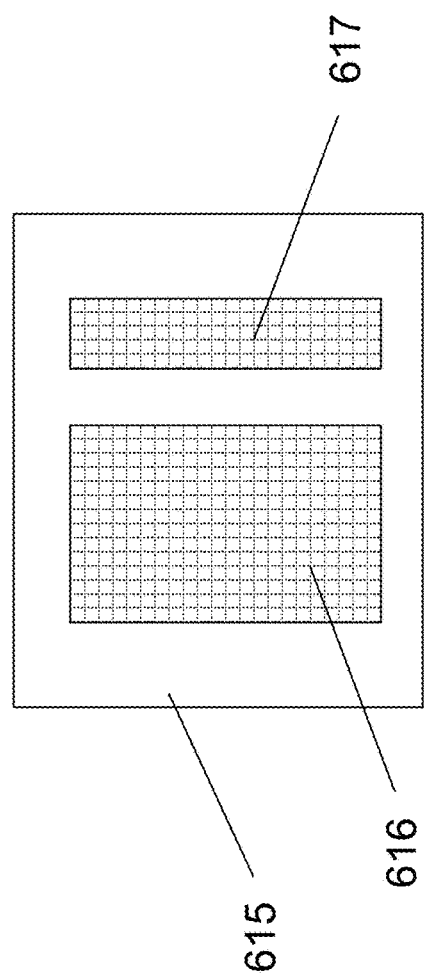
FIG. 6B illustrates a bottom-view of an embodiment of a miniature illumination package of FIG. 6A.

FIG. 6A illustrates a side-view of an embodiment of a miniature illumination package 600 of the present teaching comprising a surface mount. FIG. 6B illustrates a bottom-view of an embodiment of a miniature illumination package 600 of FIG. 6A. FIGS. 6A-B illustrate the features of the underside of the molded package structure 615 showing the feedthrough pads 616, 617. This provides contact pads for surface mount soldering the package 600 to a printed circuit board. In addition, in this embodiment, the VCSEL device 618 is a surface mount VCSEL shown bonded in the package 600. In this configuration, the two VCSEL pads align with the package pads and the VCSEL bonded in place. There is no need for the separate wire bonding step in the assembly process.

Figure 7A:
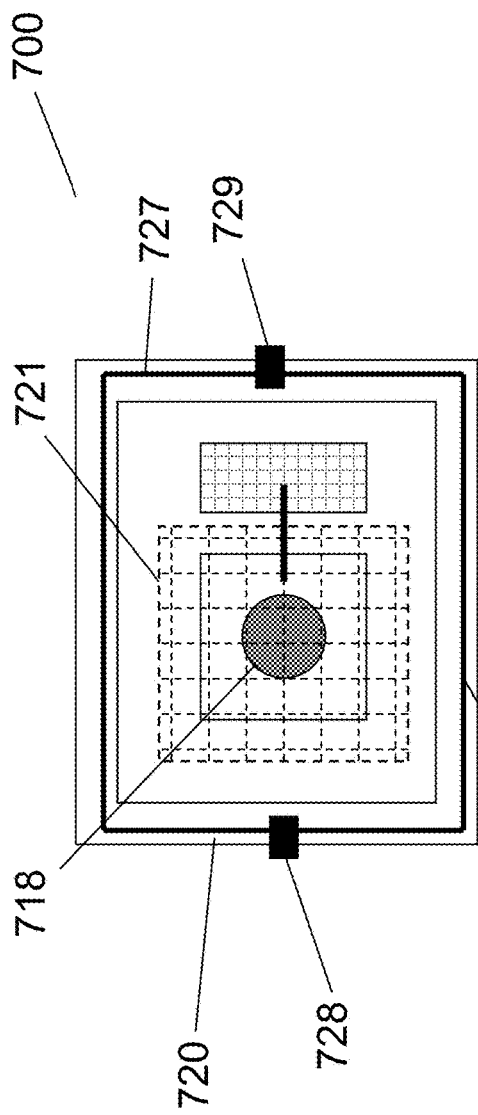
FIG. 7A illustrates a top-view of an embodiment of a miniature illumination package of the present teaching comprising a laser safety function.
Figure 7B:
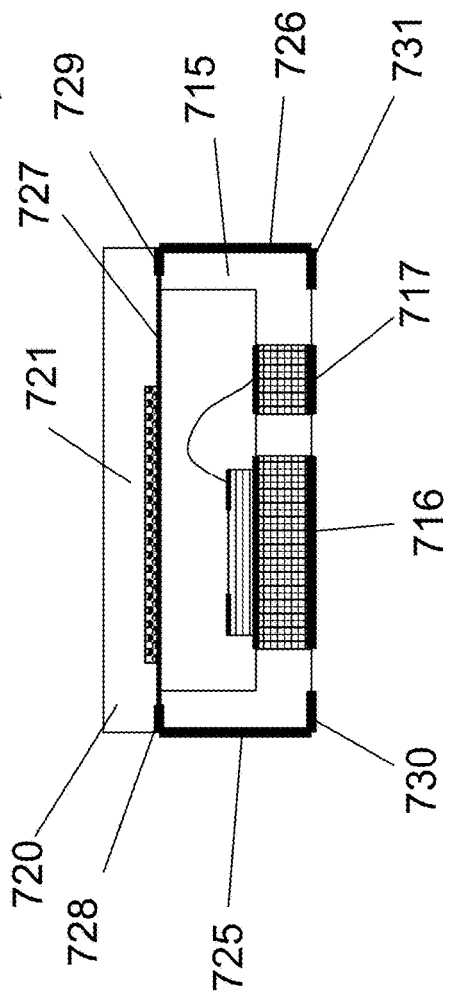
FIG. 7B illustrates a side-view of an embodiment of a miniature illumination package of FIG. 7A.

FIG. 7A illustrates top-view of an embodiment of a miniature illumination package 700 of the present teaching comprising a laser safety function. FIG. 7B illustrates a side-view of an embodiment of a miniature illumination package 700 of FIG. 7A. A metal conducting electrical trace 727 is fabricated on the bottom side of the optical component 720. Electrical pads 728, 729 are fabricated in the molded structure 715 and extend from the top of the package walls to the bottom side. These electrical pads 728, 729 connect to the metal conducting electrical trace 727 on the optical component 720. The molded structure 715 includes two or more conducting pillars 725, 726 in the side walls of the molded structure 715 which extend from the bottom side to the top of the sidewalls. These conducting pillars have electrical pads 730, 731 on the bottom and have electrical pads 728, 729 on the top of the sidewalls. The bottom pads 730, 731 are for surface mount soldering to make contact to the printed circuit board. The optical component 720 has a metal conducting electrical trace 727 routed from one side to the opposite side and fabricated on the bottom side of the optical component 720. The trace 727 is located outside the optical functional structure 721 so that it does not affect the VCSEL device 718 output beam characteristics. The conducting electrical trace 727 forms part of an electrical circuit that can be used to determine whether the optical component has been dislodged, detached, broken, and/or otherwise damaged, thereby providing a safety interlock function.

When the optical component 720 is attached to the molded structure 715, a conductive bonding agent is used at the location of the top pads 728, 729 to provide electrical contacts between the pillars 725, 726 and the conductive electrical trace 727 on the optical component 720. This assembly process results in electrical continuity between the bottom pads 730 and 731 by passing through the pillars 725, 726, the top pad connections 728, 729 and the conductive trace 727 on the optical component 720. A non-electrically conductive bonding agent is used to complete the attachment of the optical component 720 to the other parts of the molded structure 715 sidewall top.

FIG. 8A illustrates top-view of an embodiment of a miniature illumination package 800 comprising an electrical trace on the top of an optical component of the present teaching. FIG. 8B illustrates a side-view of an embodiment of a miniature illumination package 800 of FIG. 8A. FIG. 8C illustrates a bottom-view of an embodiment of a miniature illumination package 800 of FIG. 8A. FIG. 8D illustrates a perspective-view of an embodiment of a miniature illumination package 800 of FIG. 8A. The embodiment of the miniature illumination package 800 shown in FIGS. 8A-D includes a metal trace 827 fabricated on the top side of the optical component 820. In this arrangement, the molded package structure 815 includes an inset for the optical component 820. The electrical pads 825, 826 for the safety interlock extend to the top of the inset. The connection from the electrical pads 825, 826 is made to the trace using conductive epoxy or wire bonds. The miniature illumination package described in connection with FIGS. 8A-8D includes the safety interlock described in connection with FIGS. 7A-B.

The miniature illumination package of FIGS. 8A-8D includes a molded package structure 815 comprising a cavity for the VCSEL device 818 that is directly bonded to one of the feedthrough pads 816. The second VCSEL contact is connected to the second feedthrough pad 817. The sidewalls of the package structure 815 have an inset to hold the optical component 820 at the correct designed lateral and height location above the VCSEL 818. The sidewall extends up to become level with the top of the optical component 820.

The optical component 820 has an electrically conductive trace 827 on the top side which is formed near the periphery of the optical component 820. The electrical trace 827 is placed so that it does not block or otherwise affect the laser output beam from the VCSEL device 818. There are two or more electrically conductive pillars 825, 826 which are molded into the package sidewalls. These have electrical pads 830, 831 connected to them on the bottom side of the molded package structure 815 for surface mount soldering to a printed circuit board. The pillars 825, 826 extend to the top of the side walls and are designed to be close to and at the same height as the electrical trace 827 on the optical component 820. During assembly of the package 800 the optical component 820 is mounted into the inset in the molded package structure 815 walls and bonded in place. Then a connection is made between the top of the pillars 825, 826 and the electrical trace 827 using conductive epoxy, wirebonds or a similar process. This assembly process results in electrical continuity from the bottom pads 830, 831, through the pillars 825, 826 to connections to top pads 828, 829, and through the conductive trace 827 on the top of the optical component 820.

FIG. 9A illustrates a top-view of an embodiment of a miniature illumination package 900 of the present teaching comprising a monitor detector 934. FIG. 9B illustrates a side-view of an embodiment of a miniature illumination package 900 of FIG. 9A. The monitor detector 934 can be used to regulate the VCSEL device 918 optical output power to eye safe power levels. The miniature illumination package 900 includes a laser safety interlock feature. The monitor detector 934 detects a reflection of the VCSEL device 918 optical beam from an optical component 920 such as a mirror. In this embodiment, a flat substrate 939 is used and the cavity is molded into the cover 940 on which is mounted the optical component. The cover 940 is shown as two separate parts. However, it will be understood by those skilled in the art that the cover 940 may be a single component that completely seals the VCSEL device 918 and the detector 934 in the miniature illumination package 900.

The substrate 939 has feedthroughs for surface mount electrical connections. In some embodiments, a large metal feedthrough 916 is mounted on the VCSEL device 918. Also, in some embodiments, the detector 934 provides a common electrical connection as well as thermal conduction path to cool the VCSEL device 918. There are feedthrough connections 917, 935 for the second connections to the VCSEL device 918 and for detector 934, respectively. These connections to the VCSEL device 918 and for detector 934 can utilize wire bonded wires 919, 936.

The optical component 920 has an electrical trace 927 that supports the laser safety interlock function. The electrical trace 927 is bonded to the cover 940 and electrical connections are made to electrical connection pads 937, 938 which are then connected to electrical feedthrough pads 930, 931 in the substrate 939. The cover 940 can be two parts as shown or can be a single structure. The main requirement for the cover is that there be two electrical conduction paths for the laser safety function. The optical component 920 can be bonded to the underside as shown in the figure. Alternatively, the optical component 920 can be bonded on top of the cover, or can be flush mounted.

In some embodiments, the cover 940 and optical component 920 can be made as one subassembly. For example, the assembly sequence can be as follows: (1) diebond the detector 934 and VCSEL device 918; (2) wirebond connections if needed; and (3) align and bond the cover assembly. This example of an assembly sequence is a straightforward assembly process that can be highly automated for low-cost high-volume production.

FIG. 10A illustrates a side-view of an embodiment of a miniature illumination package 1000 of the present teaching with the optical component 1020 partly detached. FIG. 10B illustrates a side-view of an embodiment of a miniature illumination package 1000 of FIG. 10A with the optical component 1020 wholly detached. If the optical component 1020 is detached in part (FIG. 10A) or wholly (FIG. 10B) from the molded package structure 1015, the electrical continuity between the bottom pads 1030, 1031 is broken. Thus, the VCSEL device 1018 can be turned off after sensing the interrupt so the direct laser beam is not emitted from the package. Thus, if the optical component 1020 includes a diffuser, then the miniature illumination package 1000 experiences a circuit break when the diffuser bond is broken.

FIGS. 10A-B illustrate the functioning of the laser safety interrupt. In normal operation, the optical component 1020 acts to modify the laser beam emitted from the VCSEL device 1018 so that the intensity level is below the laser safety threshold at the nearest point the human eye can reach. This modification is in addition to the modification used to form the illumination beam into the designed structure for proper operation of the apparatus. In some embodiments, the optical component 1020 comprises a diffuser 1021 that provides this function. The eye safe location may be at various locations, such as at the top of the optical component 1020, or may be further away, depending on the design of the apparatus containing the miniature illuminator.

Many embodiments of the miniature illuminator are designed so that when an incident that damages the apparatus in a way that dislodges (illustrated in FIG. 10A as separation 1042) the optical component 1020 from the illuminator molded package structure 1015, the VCSEL is deactivated. For example, in a relatively minor miniature illuminator damage incident where there is a partial dislodgement with one side being de-bonded from the package as shown in FIG. 10A, the electrical bond 1029 between the optical component electrical trace 1027 and the pillar 1026 is broken. This results in a break in the electrical continuity between the contact pads 1030 and 1031. An interrupt circuit on the printed circuit board senses this break in electrical continuity and switches the VCSEL off. It should be noted that even if the dislodgement occurs on a side which does not contain a connection 1028, 1029, it would still lift the optical component 1020 up, or laterally displace the optical component 1020, and cause a break in one or both connections between trace 1027 and pillars 1025, 1026 breaking the electrical continuity.

FIG. 10B illustrates an example of more major damage to the miniature illuminator that results in more complete dislodgement where the optical component 1020 is completely de-bonded (illustrated as displacements 1043, 1044) from the molded structure package 1015. The result would be the same, causing a break in the electrical continuity between contacts 1030 and 1031.

Figure 11:
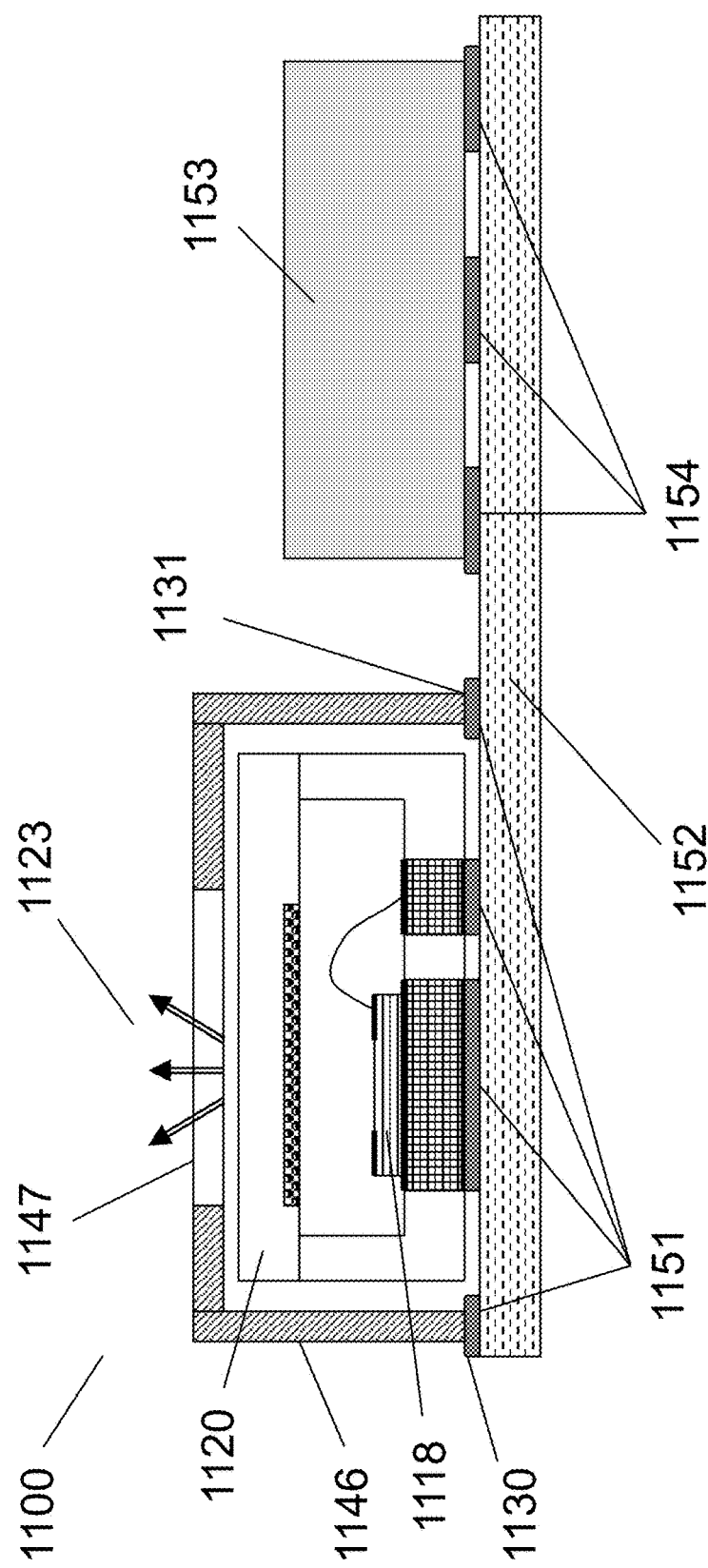
FIG. 11 illustrates an embodiment of a miniature illuminator system comprising a miniature illumination package surface mount soldered onto a printed circuit board of the present teaching.

One feature of the present teaching is that the VCSEL illuminator and other electronic components can be surface mount assembled together on the printed circuit board. FIG. 11 illustrates a miniature illuminator system 1100 comprising a miniature illuminator package surface mount soldered using contacts 1151 onto a printed circuit board 1152. In some embodiments, the miniature illuminator system 1100 is soldered to a printed circuit board 1152 along with integrated circuits 1153 and other electronic components, which may include optical sensors and the interrupt circuit used to implement the laser safety feature. For example, the electronic components may function to activate the VCSEL device 1118 so that illumination 1123 is generated in a region. Sensors (not shown) can be used to measure the reflected VCSEL beams. Electronics can be used to record images and to compute the arrangement of various features and objects in the particular region of illumination.

FIG. 11 also includes a laser safety function. A conducting structure 1146 is positioned over the diffuser package and electrically connected via contacts 1130, 1131 to pads 1151 on the printed circuit board 1152. The conducting structure 1146 has an aperture 1147 to allow the VCSEL beam to propagate out, providing illumination 1123. Disrupting the optical component 1120 on the diffuser package would knock all or part of the conducting structure 1146 off the printed circuit board 1152, breaking the electrical continuity between the pads 1151.

Figure 12:
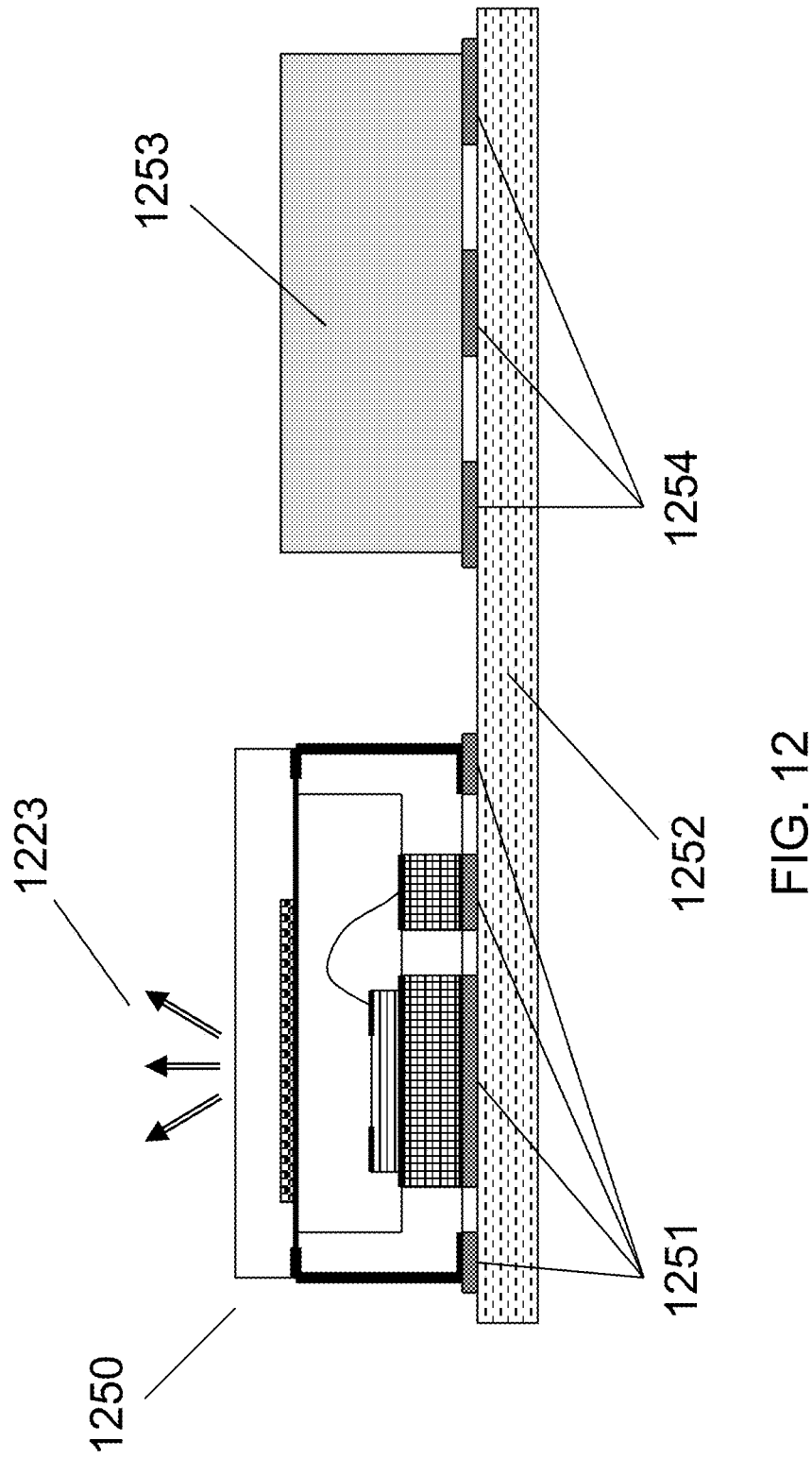
FIG. 12 illustrates an embodiment of a miniature VCSEL illuminator with the integrated laser safety feature surface mount soldered onto a printed circuit board according to the present teaching.

FIG. 12 illustrates an embodiment of a miniature VCSEL illuminator system 1250 with the integrated laser safety feature surface mount soldered via contacts 1251 onto a printed circuit board 1252. For example, the laser safety feature described in connection with FIG. 10A-B can be used as part of the VCSEL illuminator system 1250. The integrated laser safety feature of the embodiment of FIG. 12 results in a smaller, more compact assembly on the circuit board than the embodiment of FIG. 11. In addition, the integrated laser safety feature embodiment illustrated in FIG. 12 reduces and simplifies the printed circuit board assembly procedure by eliminating the assembly step of aligning and bonding the conducting structure (element 1146 of FIG. 11). In a typical application, the VCSEL illuminator 1250 would be soldered to a printed circuit board 1252 along with integrated circuits 1253 that are surface mount soldered via contacts 1254 to the printed circuit board 1252 together with other electronic components, including optical sensors. For example, the integrated circuits can include an interrupt circuit. These integrated circuits 1253 and other electronic components including optical sensors function to activate the VCSEL device to generate illumination 1223 in the region and the sensors would record the reflected VCSEL beams and the electronics would record images and compute the arrangement of various features and objects the region.

It will be apparent to those skilled in the art that there are many different miniature illuminator package configurations according to the present teaching that can be used for numerous applications and that are suitable for various assembly requirements. It is understood that the present teaching is described with reference to a few particular embodiments and that numerous other embodiments including combinations and sub-combinations of elements described herein are possible, depending on particular VCSELs or VCSEL arrays required for the illuminator applications.

EQUIVALENTS

While the Applicant's teaching is described in conjunction with various embodiments, it is not intended that the Applicant's teaching be limited to such embodiments. On the contrary, the Applicant's teaching encompass various alternatives, modifications, and equivalents, as will be appreciated by those of skill in the art, which may be made therein without departing from the spirit and scope of the teaching.

We claim:

1. A Vertical Cavity Surface Emitting Lasers (VCSEL) illuminator module comprising:
    a) a module forming a physical cavity having first electrical contact pads positioned on an inner surface of the module that are electrically coupled through the module to second electrical contact pads positioned on an outer surface of the module, wherein the second electrical contact pads are configured for surface mounting to a printed circuit board;
    b) a surface mount VCSEL device positioned on the inner surface of the module, the VCSEL device comprising electrical contacts, a first one of which is die bonded directly to a first one of the first electrical contact pads and a second one of which is electrically connected to a second one of the first electrical contact pads, the VCSEL device being operable to generate an optical beam when current is applied to the electrical contacts; and
    c) an optical element positioned adjacent to an emitting surface of the VCSEL device, the optical element being configured to modify the optical beam generated by the VCSEL device.

2. The VCSEL illuminator module of claim 1 wherein a lateral dimension of the VCSEL illuminator module is less than or equal to 3 mm and a thickness of the VCSEL illuminator module is less than or equal to 1.375 mm.

3. The VCSEL illuminator module of claim 1 wherein the module forming the cavity is formed of thermal setting plastic suitable for surface mounting.

4. The VCSEL illuminator module of claim 1 wherein the VCSEL illuminator module is environmentally sealed.

5. The VCSEL illuminator module of claim 1 wherein the electrical contacts positioned on the inner surface of the module that feed through the module to the electrical contacts positioned on the outer surface of the module are formed from at least one of copper and aluminum.

6. The VCSEL illuminator module of claim 1 wherein the optical element comprises a lens that reduces a divergence angle of the optical beam generated by the VCSEL device.

7. The VCSEL illuminator module of claim 1 wherein the optical element comprises a diffuser that increases a divergence angle of the optical beam generated by the VCSEL device.

8. The VCSEL illuminator module of claim 7 wherein the diffuser increases the divergence of the optical beam generated by the VCSEL device to an angle that is greater than or equal to 110 degrees.

9. The VCSEL illuminator module of claim 1 wherein the VCSEL device comprises an array of VCSEL devices.

10. The VCSEL illuminator module of claim 9 wherein the optical element comprises a microlens array aligned to the array of VCSEL devices.

11. The VCSEL illuminator module of claim 1 wherein the optical element is positioned on the module.

12. The VCSEL illuminator module of claim 1 further comprising a detector that monitors an output intensity of the optical beam generated by the VCSEL device.

13. The VCSEL illuminator module of claim 12 wherein the detector detects a reflection of the optical beam generated by the VCSEL device from an optical component.

14. The VCSEL illuminator module of claim 1 further comprising a safety lock cover positioned adjacent to the emitting surface of the VCSEL device.

15. A Vertical Cavity Surface Emitting Lasers (VCSEL) illuminator module comprising:
   a module forming a physical cavity having electrical contacts positioned on an inner surface of the module that feed through the module to electrical contacts positioned on an outer surface of the module;
   a VCSEL device positioned on the inner surface of the module, the VCSEL device comprising electrical contacts that are electrically connected to the electrical contacts positioned on the inner surface of the module, the VCSEL device generating an optical beam when current is applied to the electrical contacts;
   an optical element positioned adjacent to an emitting surface of the VCSEL device, the optical element being configured to modify the optical beam generated by the VCSEL device; and
   a safety lock cover positioned adjacent to the emitting surface of the VCSEL device, wherein the safety lock cover is electrically connected to the VCSEL illuminator module and configured so that detaching the safety lock cover from the VCSEL illuminator module breaks an electrical contact with the module.

16. A Vertical Cavity Surface Emitting Lasers (VCSEL) illuminator module comprising:
   a module forming a physical cavity having electrical contacts positioned on an inner surface of the module that feed through the module to electrical contacts positioned on an outer surface of the module;
   a VCSEL device positioned on the inner surface of the module, the VCSEL device comprising electrical contacts that are electrically connected to the electrical contacts positioned on the inner surface of the module, the VCSEL device generating an optical beam when current is applied to the electrical contacts; and
   an optical element positioned adjacent to an emitting surface of the VCSEL device, the optical element being configured to modify the optical beam generated by the VCSEL device, wherein the optical element further comprises an electrical trace that provides a laser safety interlock function.

17. The VCSEL illuminator module of claim 16 wherein the electrical trace is electrically connected to an electrical circuit and is configured so that dislodging the optical element from the VCSEL illuminator module causes the VCSEL device to be turned off.

18. A Vertical Cavity Surface Emitting Lasers (VCSEL) illuminator module with integral safety lock, the VCSEL illuminator module comprising:
   a) a module forming a physical cavity having electrical contacts positioned on an inner surface of the module that feed through the module to electrical contacts positioned on an outer surface of the module;
   b) a VCSEL device positioned on the inner surface module, the VCSEL device comprising electrical contacts that are electrically connected to the electrical contacts positioned on the inner surface of the module, the VCSEL device generating an optical beam when current is applied to the electrical contacts; and
   c) an optical element positioned on the module adjacent to an emitting surface of the VCSEL device and comprising electrical contacts on a surface that are configured to electrically connect to electrical contacts positioned on the outer surface of module so as to complete an electrical circuit, the optical element configured to modify the optical beam generated by the VCSEL device.

19. The VCSEL illuminator module with integral safety lock of claim 18 wherein the electrical contacts on the surface of the optical element are aligned to the electrical contacts on the outer surface of the module.

20. The VCSEL illuminator module with integral safety lock of claim 18 wherein the electrical contacts on the surface of the optical element are electrically connected to the electrical contacts positioned on the outer surface of the module with one or more conducting layer traces.

21. The VCSEL illuminator module with integral safety lock of claim 20 wherein the one or more conducting traces are positioned outside an optical path of the optical beam generated by the VCSEL device.

22. The VCSEL illuminator module with integral safety lock of claim 18 further comprising a detector that monitors an output intensity of the optical beam generated by the VCSEL device.

23. The VCSEL illuminator module with integral safety lock of claim 22 wherein the detector detects a reflection of the optical beam generated by the VCSEL device from an optical component.

24. The VCSEL illuminator module of claim 18 wherein the electrical contacts positioned on the outer surface of the module are configured for surface mounting to a printed circuit board.

25. The VCSEL illuminator module of claim 18 wherein the VCSEL device comprises a surface mount VCSEL device comprising electrical contacts electrically connected to the electrical contacts positioned on the inner surface of the module.

26. The VCSEL illuminator module of claim 18 wherein the optical element comprises a lens that reduces a divergence angle of the optical beam generated by the VCSEL device.

27. The VCSEL illuminator module of claim 18 wherein the optical element comprises a diffuser that increases a divergence angle of the optical beam generated by the VCSEL device.

28. The VCSEL illuminator module of claim 18 wherein the VCSEL device comprises an array of VCSEL devices.

29. The VCSEL illuminator module of claim 28 wherein the optical element comprises a microlens array aligned to the array of VCSEL devices.

30. A Vertical Cavity Surface Emitting Lasers (VCSEL) illuminator module with integral safety lock, the VCSEL illuminator module comprising:
   a) a substrate comprising electrical contact pads positioned on a top surface that are electrically connected to electrical contact pads on a bottom surface of the substrate, b) a VCSEL device positioned on the top surface of the substrate and being electrically connected to the electrical contact pads positioned on the bottom surface of said substrate c) a cover comprising side walls bonded to the substrate, the side walls comprising electrical conducting sections that are electrically connected to contact pads positioned on bottom of the substrate; and d) an optical element positioned in the side walls of the cover and comprising an electrical conducting trace that is electrically connected to the electrical conducting side walls, the optical element configured to modify the characteristics of an optical beam generated by the VCSEL device.

31. The VCSEL illuminator module with integral safety lock of claim 30 wherein the cover comprises a two part cover.

32. The VCSEL illuminator module with integral safety lock of claim 30 wherein the cover seals the VCSEL device.

33. The VCSEL illuminator module with integral safety lock of claim 30 wherein the sidewall extends up to become level with a top surface of the optical component.

34. The VCSEL illuminator module with integral safety lock of claim 30 further comprising a detector positioned on the substrate that monitors an output intensity of the optical beam generated by the VCSEL device.

35. The VCSEL illuminator module with integral safety lock of claim 34 wherein the detector provides a common electrical connection and a thermal conduction path to the VCSEL device.

* * * * *